US009446519B2

(12) United States Patent
Gray et al.

(10) Patent No.: US 9,446,519 B2
(45) Date of Patent: Sep. 20, 2016

(54) REMOTE TESTING METHOD AND SYSTEM

(71) Applicant: VMware, Inc., Palo Alto, CA (US)

(72) Inventors: Gavin Gray, Cambridge, MA (US);
Ben Duong, Cambridge, MA (US)

(73) Assignee: AirWatch LLC, Atlanta, GA (US)

( * ) Notice: Subject to any disclaimer, the term of this patent is extended or adjusted under 35 U.S.C. 154(b) by 147 days.

(21) Appl. No.: 13/874,425

(22) Filed: Apr. 30, 2013

(65) Prior Publication Data

US 2014/0324220 A1 Oct. 30, 2014

(51) Int. Cl.
| | |
|---|---|
| *B25J 9/16* | (2006.01) |
| *G06F 11/26* | (2006.01) |
| *G01R 31/28* | (2006.01) |
| *G06F 11/22* | (2006.01) |
| *G06F 3/0488* | (2013.01) |
| *H04M 1/24* | (2006.01) |
| *G06F 3/044* | (2006.01) |
| *B25J 13/08* | (2006.01) |
| *G06F 3/041* | (2006.01) |
| *G01R 31/319* | (2006.01) |

(52) U.S. Cl.
CPC .............. *B25J 9/1679* (2013.01); *B25J 9/1697* (2013.01); *B25J 13/081* (2013.01); *G01R 31/2889* (2013.01); *G06F 3/044* (2013.01); *G06F 3/0488* (2013.01); *G06F 11/2221* (2013.01); *G06F 11/26* (2013.01); *H04M 1/24* (2013.01); *B25J 9/161* (2013.01); *G01R 31/31907* (2013.01); *G05B 2219/40041* (2013.01); *G05B 2219/40174* (2013.01); *G05B 2219/45089* (2013.01); *G06F 3/0416* (2013.01)

(58) Field of Classification Search
CPC ...... H04M 1/24; B25J 9/1697; B25J 13/081; B25J 9/161; G06F 11/2221; G06F 11/26; G06F 3/044; G06F 3/0488; G06F 3/0416; G01R 31/2889; G01R 31/31907; G05D 1/0033; G01M 99/008; G05B 2219/45089; G05B 2219/40174; G05B 2219/40041
USPC ....... 700/250, 253, 254, 257, 247, 259, 262, 700/264; 702/108, 116, 119, 120, 123, 124, 702/126
See application file for complete search history.

(56) References Cited

U.S. PATENT DOCUMENTS

| | | | | |
|---|---|---|---|---|
| 6,408,226 | B1 * | 6/2002 | Byrne .................. | G05D 1/0297 318/568.11 |
| 7,646,193 | B2 * | 1/2010 | Suzuki ................ | G01M 99/008 324/756.01 |
| 8,806,280 | B2 * | 8/2014 | Stephenson et al. ........ | 714/38.1 |
| 2004/0183787 | A1 * | 9/2004 | Geaghan ............... | G06F 3/0488 345/173 |
| 2008/0133052 | A1 * | 6/2008 | Jones ...................... | B25J 5/007 700/245 |
| 2009/0265035 | A1 * | 10/2009 | Jenkinson et al. ............ | 700/259 |
| 2010/0109692 | A1 * | 5/2010 | Li et al. ........................ | 324/754 |
| 2011/0054824 | A1 * | 3/2011 | Lien et al. .................... | 702/108 |
| 2011/0224828 | A1 * | 9/2011 | Breznak .................... | B25J 9/08 700/264 |
| 2012/0146956 | A1 * | 6/2012 | Jenkinson ..................... | 345/178 |
| 2012/0280934 | A1 * | 11/2012 | Ha et al. ....................... | 345/174 |

(Continued)

*Primary Examiner* — Jason Holloway
(74) *Attorney, Agent, or Firm* — Thomas | Horstemeyer, LLP

(57) ABSTRACT

In one example, a method is provided for a computing device to facilitate testing of an electronic apparatus. The method includes receiving a request from an apparatus coupled to a network to which the computing device is also coupled. The method further includes retrieving a command for a robot controlled by the computing device from the request, and configuring the robot to physically interface with the electronic apparatus to perform one or more tests according to the command.

14 Claims, 5 Drawing Sheets

(56) References Cited

U.S. PATENT DOCUMENTS

| | | | |
|---|---|---|---|
| 2013/0211770 A1* | 8/2013 | Dresler et al. | 702/123 |
| 2013/0227348 A1* | 8/2013 | Stephenson et al. | 714/27 |
| 2013/0278539 A1* | 10/2013 | Valentine et al. | 345/174 |
| 2013/0345864 A1* | 12/2013 | Park | 700/248 |

* cited by examiner ns in this application and are not admitted to be prior art by inclusion in this section.
REMOTE TESTING METHOD AND SYSTEM

BACKGROUND

Unless otherwise indicated herein, the approaches described in this section are not prior art to the claims in this application and are not admitted to be prior art by inclusion in this section.

Testing is a key element in developing robust mobile technologies. Some testing approaches involve utilizing an emulator, which merely approximates the actual device being tested and is thus less precise, or setting up a testing facility dedicated to test actual devices, which is likely cost prohibitive. Yet another testing approach involves placing actual devices in a third party tester's facility off-premise and remotely testing one or more of these actual devices. However, one shortcoming of this remote testing approach is to store non-trivial number of actual devices, some of which may be pre-production units and thus not known to the public, in the facility of a third party tester. Another shortcoming is that the tester typically transmits all of the test results for the actual devices back to a developer of the actual devices, and such transmissions may occupy significant network resources.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are therefore not to be considered limiting of its scope. The disclosure will be described with additional specificity and detail through use of the accompanying drawings.

DETAILED DESCRIPTION

As used herein, the term "includes" means includes but not limited to, and the term "including" means including but not limited to. The terms "a" and "an" are intended to denote at least one of a particular element. The term "based on" means based at least in part on. The term "according to" means according at least in part to.

In some embodiments of the present disclosure, a system may be configured to remotely test an electronic apparatus. The system may include a first computing device and a computing device both coupled to a network. The first computing device may be configured to transmit a command through the network to the second computing device. The second computing device may be configured to control a robot to physically interface with the electronic apparatus according to the command. The system may further include a video recorder to record the testing process while the robot performs one or more tests on the electronic apparatus.

Figure 1:
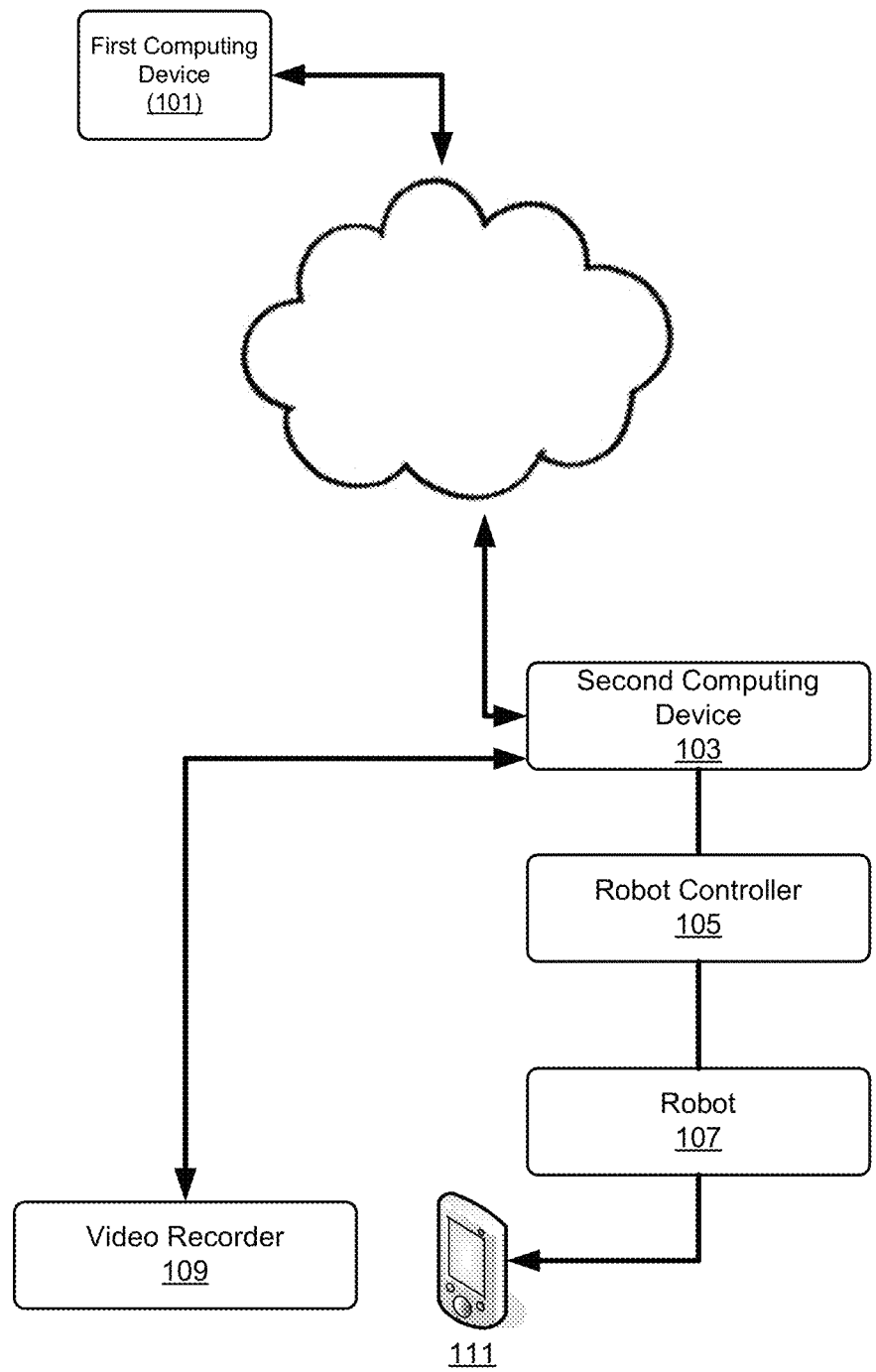
FIG. 1 is a block diagram of a system configured to remotely test an electronic apparatus, according to one embodiment of the present disclosure.

FIG. 1 is a block diagram of a system 100 configured to remotely test an electronic apparatus 111, according to one embodiment of the present disclosure. The system 100 includes a first computing device 101, a second computing device 103, a robot controller 105, a robot 107, and a video recorder 109. The first computing device 101 is coupled to a network, such as, without limitation, a local area network, a wide area network, and others. Some examples of the first computing device 101 include, without limitation, a handheld device, a smart phone, a desktop computer, a tablet, and a laptop computer. The first computing device 101 may include a user interface provided for a user to input a request. An example request may be a Hypertext Transfer Protocol (HTTP) request. More specifically, an example request may be a POST request and/or a GET request.

The second computing device 103 is coupled to the same network to which the first computing device 101 is also coupled. In one configuration, except for the first computing device 101, the second computing device 103, the robot controller 105, the robot 107, the electronic apparatus 111, and the video recorder 109 may be adjacent to one another. The request transmitted from the first computing device 101 may include address information (e.g., Internet Protocol address) identifying the second computing device 103. The request may also include a command for the robot 107 and/or a command for the video recorder 109. The command for the robot 107 may be a movement command, which may include movement information, such as, without limitation, movement axis and direction information for the robot 107. The command for the video recorder 109 may be a video related command, which may include, without limitation, a command to start or stop a recording session, a command to download a recorded video file, and a command to track the duration of a recording session.

After receiving the request from the first computing device 101, the second computing device 103 may be configured to process the request and the command embedded in the request. The second computing device 103 may generate general purpose input/output (GPIO) related signals for the robot controller 105. Subsequent paragraphs will provide additional details for the second computing device 103 and the process of handling the received requests.

After the robot controller 105 receives GPIO related signals, such as, without limitation, a step GPIO signal to pulse a stepper motor to move a step and a direction GPIO signal to step the stepper motor in a certain direction, from the second computing device 103, it is configured to generate a control signal for the robot 107.

The robot 107 is configured to physically interface with the electronic apparatus 111. The robot 107 may include one or more stepper motors. In some embodiments, the control signal from the robot controller 105 may drive the stepper motor, which then may cause the robot 107 to move. In some embodiments, the robot 107 may be configured to control and/or manipulate an accessory, such as a stylus, to physically interface with the electronic apparatus 111. By physically interfacing with the electronic apparatus 111, the robot 107 may perform various tests on the electronic apparatus 111. Additional examples will be provided in subsequent paragraphs to describe movements of the robot 107 and/or the stylus. The video recorder 109 is configured to capture an image or a video clip of a test being performed on the electronic apparatus.

Figure 2:
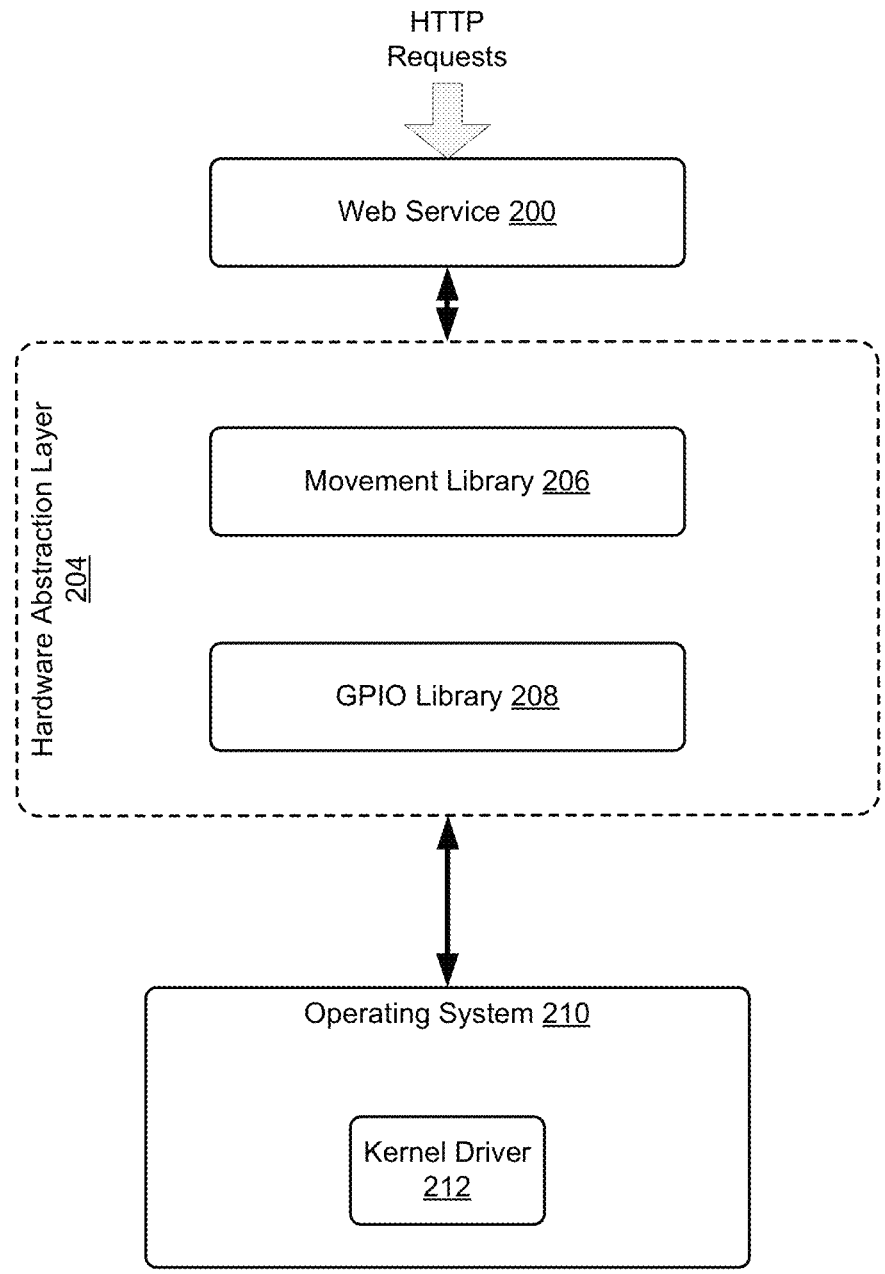
FIG. 2 illustrates an example block diagram of functional components in a computing device coupled to a network to facilitate testing of an electronic apparatus, according to one embodiment of the present disclosure.

FIG. 2 illustrates an example block diagram of functional components in a computing device coupled to a network to facilitate testing of an electronic apparatus, such as the second computing device 103 of FIG. 1, according to one embodiment of the present disclosure. The second computing device 103 includes a web service component 200, a hardware abstraction layer 204, and an operating system 210. The web service component 200 may be used to facilitate communications between the second computing device 103 and the first computing device 101 of FIG. 1. The web service component may be implemented in a programming frame work such as, without limitation, Groovy and Groovy on Rails (Grails). The hardware abstraction layer 204, which may include a movement library 206 and a GPIO library 208, may be used to map a command embedded in a request received by the second computing device 103 to a GPIO related signal for the robot controller 105.

In some embodiments, the movement library 206 may include mapping information between a movement command embedded in the request and axis movements of the robot 107. The GPIO library 208, on the other hand, may include mapping information between the axis movements of the robot 107 to GPIO related signals that need to be asserted to cause such movements. The kernel driver 212 in the operating system 210 may be configured to assert the GPIO related signals to the robot controller 105.

To illustrate, suppose the first computing device 101 of FIG. 1 sends a command to the robot 107 by making a HTTP request in a form of <Uniform Resource Locator (URL) for the robot 107>/gpio/moveRight. <URL for the robot 107> here may correspond to an IP address assigned to the second computing device 103. In accordance with the movement libruary 206 in the hardware abstraction layer 204 of FIG. 2, the movement comment "moveRight" is mapped to a movement of the robot 107 in the x-axis and to the right. In accordance with the GPIO library 208 in the hardware abstraction 204 of FIG. 2, the movement in the x-axis is further mapped to certain GPIO related signals (e.g., the above mentioned step GPIO signal and the direction GPIO signal, such as to step a stepper motor in a clockwise or counterclockwise direction), which the kernel driver 212 may assert to the robot controller 105. The first computing device 101 may send other movement commands, such as, without limitation, moveLeft, moveUp, moveDown, moveForward, and moveBackward, to the second computing device 103 to cause the robot 107 to move in different axes. In some other embodiments, the movement commands may include distance information to define how far along an axis the robot 107 may move.

Figure 3:
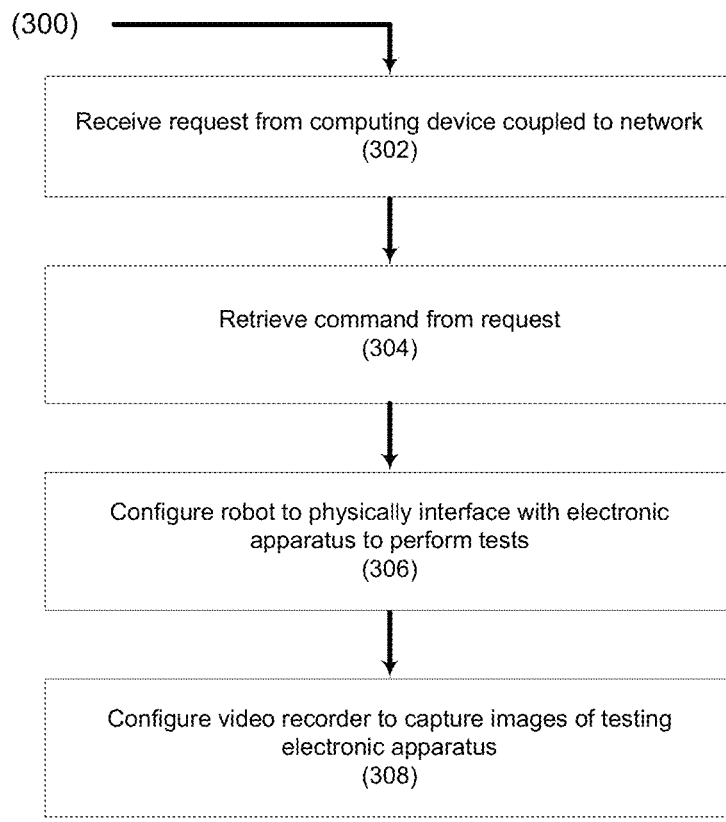
FIG. 3 illustrates a flowchart of a method for a computing device coupled to a network to facilitate testing of an electronic apparatus, according to one embodiment of the present disclosure.

FIG. 3 illustrates a flowchart of a method 300 for a computing device coupled to a network, such as the second computing device 103 of FIG. 1, to facilitate testing of an electronic apparatus, according to one embodiment of the present disclosure. Any method described herein may include one or more operations, functions, or actions illustrated by one or more blocks. Although the blocks are illustrated in sequential orders, these blocks may also be performed in parallel, and/or in a different order than those described herein. Also, the various blocks may be combined into fewer blocks, divided into additional blocks, and/or eliminated based upon the desired implementation. Method 300 may begin in block 302.

In block 302, the second computing device 103 receives a request from another computing device coupled to the network, such as the first computing device 101. The request may also include one or more commands. Block 302 may be followed by block 304.

In block 304, the second computing device 103 retrieves the one or more commands from the request. One example command is a movement command for a robot, such as the robot 107. The movement command, as discussed above, may include movement axis, direction, and/or distance information. With such information, the movement command may cause the robot 107 to move, for instance, along an x-axis direction to the right for 2 cm. Another example command is a video related command for a video recorder, such as the video recorder 109. The video related command may cause the video recorder 109 to start or stop a recording session, download a recorded video file, and track the duration of a recording session. Block 304 may be followed by block 306.

In block 306, the second computing device 103 configures the robot 107, by going through the hardware abstraction layer 204 of FIG. 2 as discussed above and asserting GPIO related signals to a robot controller, such as the robot controller 105, to physically interface with the electronic apparatus to perform one or more tests. For example, the robot 107 may be configured to physically interface with the screen of the electronic apparatus to perform one or more tests on the electronic apparatus. One test may be to test a login screen of the electronic apparatus. Another test may be to verify whether a feature of an application running on the electronic apparatus is operational. For instance, an item associated of the application may be clicked on to check whether the corresponding function is properly invoked. Yet another test may be to stress test the electronic apparatus. For instance, certain spots on the screen of the electronic apparatus may be repeatedly pressed to check whether a crash would occur. In some embodiments, as the robot 107 physically interfaces with the electronic apparatus, the electronic apparatus may be configured to maintain a log capturing all the test related events (e.g., when and what errors occur under what circumstances), and this log may be subsequently reviewed and analyzed. Block 306 may be followed by block 308.

In block 308, the second computing device 103 configures the video recorder 109 to capture images and/or video clips of performing tests on the electronic apparatus. Using one of the examples discussed above, the robot 107 may be configured to stress test the electronic apparatus by repeatedly pressing on certain spots of the screen of the electronic appartus, and the video recorder 109 may be configured to capture images and/or video clips of how the electronic apparatus is being tested and responds to the testing. In some embodiments, the second computing device 103 may be configured to process the captured images or video clips from the video recorder 109 and transmit a status of the testing, instead of the captured images or videos, back to the computing device 101 on the network. For instance, suppose the captured images and/or video clips show that the electronic appartus suffers a crash after the robot 107 presses the upper right hand corner of the screen 1000 times within a certain period of time. Rather than transmitting all the captured images and/or video clips back to the computing device 101, the second computing device 103 may prepare and transmit a status of the testing indicating the occurrence of the crash and/or the condition under which the crash occurred. Alternatively, the log maintained in the electronic apparatus may be retrieved and then analyzed along with the captured images and/or videos. Suppose the log includes a failure event associated with the electronic apparatus. A person reviewing this failure event may also review the captured images and/or video clips to determine whether the failure event is from a bug in the electronic apparatus or from some othe unexpected factors, such as network issues, power issues, or unanticipated movements of the electronic apparatus.

Figure 4:
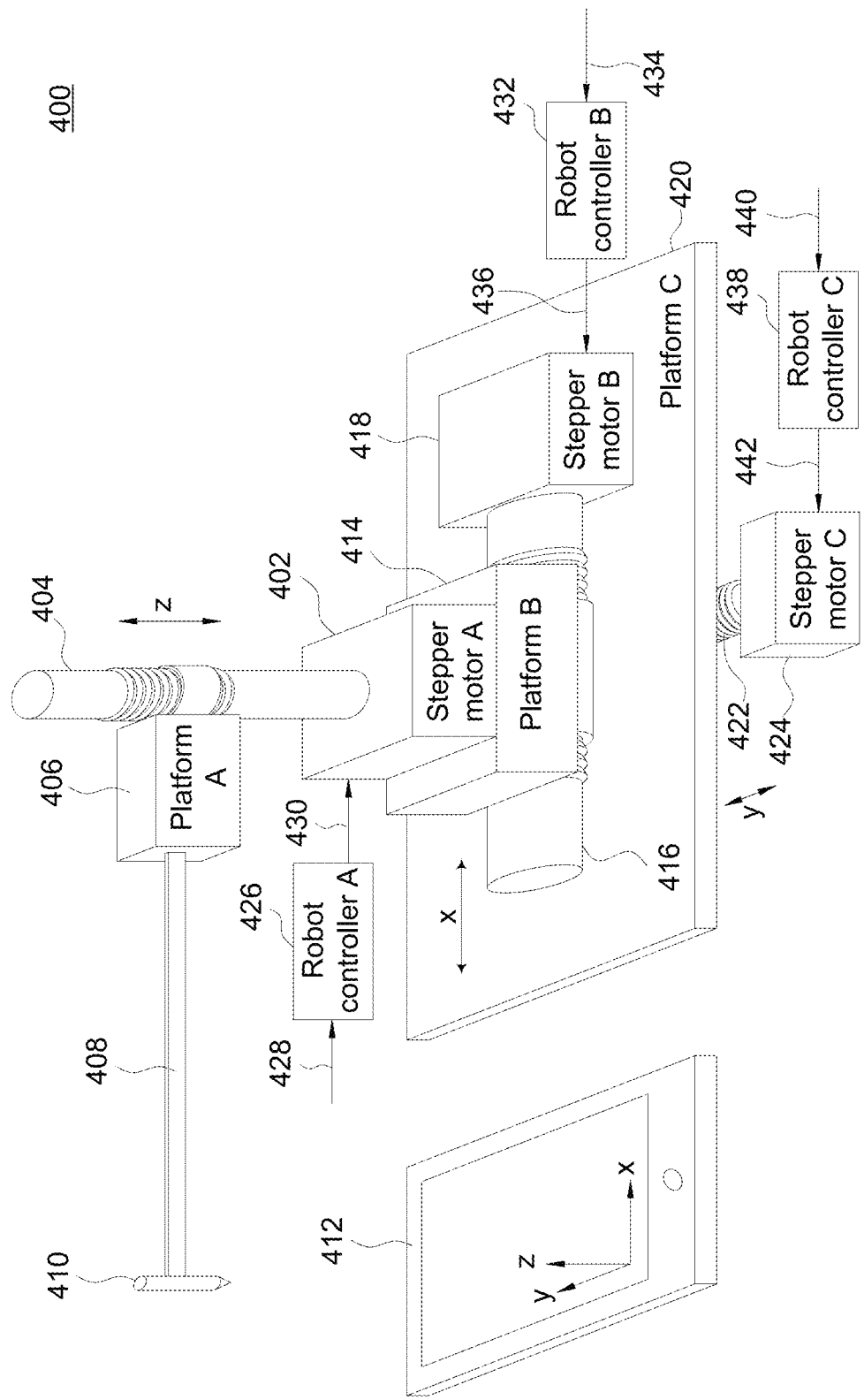
FIG. 4 is an example block diagram of a robot configured to test an electronic apparatus, according to one embodiment of the present disclosure.

FIG. 4 is an example block diagram of a robot 400 configured to test an electronic apparatus 412, according to one embodiment of the present disclosure. The robot 400 may correspond to the robot 107 of FIG. 1. The robot 400 may include three sets of stepper motors, platforms, and bolts. In particular, a stepper motor A 402, a first bolt 404, and a platform A 406 mainly move in a z-axis direction. A stepper motor B 418, a second bolt 416, and a platform B 414 mainly move in an x-axis direction. A stepper motor C 424, a third bolt 422, and a platform C 420 mainly move in a y-axis direction. The robot 400 may also include a robot arm 408, which is coupled to the platform A 406. The robot arm 408 may be coupled to a stylus 410. So, to move the stylus 410 in a z-axis direction, the stepper motor A 402 is configured to turn the first bolt 404, causing the platform A 406 and the robot arm 408 coupled to the platfom A 406 to move in the z-axis direction. Similarly, to move the stylus 410 in an x-axis direction, the stepper motor B 418 is configured to turn the second bolt 416, causing the platform B 414 and also stepper motor A coupled to the platform B 414 to move in the x-axis direction. To move the stylus 410 in a y-axis direction, the stepper motor C 424 is configured to turn the third bolt 422, causing the platform C 420 and the stepper motor B 418 coupled to the platform C 420 to move in the y-axis direction.

The robot 400 may receive control signals from robot controllers, which may correspond to the robot controller 105 of FIG. 1. As discussed above, in some embodiments, a robot controller A 426 receives GPIO related signals 428 derived from movement commands from a kernel driver of a computing device (e.g., the kernel driver 212 of FIG. 2) and converts the GPIO related signals 426 into a control signal 430. With the control signal 430, the stepper motor A 402 may be configured to turn the first bolt 404 either clockwise or counterclockwise and one or more times. Similarly, a robot controller B 432 also converts receive GPIO related signals 434 into a control signal 436 for the stepper motor B 418, and a robot controller C 438 converts received GPIO related signals 440 into a control signal 442 for the stepper motor C 424. As illustrated, by causing the platform A 406, platform B 414, and/or platform C 420 to move in directions specified in the movement commands, the stylus 410 could physically interface with the electronic apparatus 412 to perform one or more tests.

Figure 5:
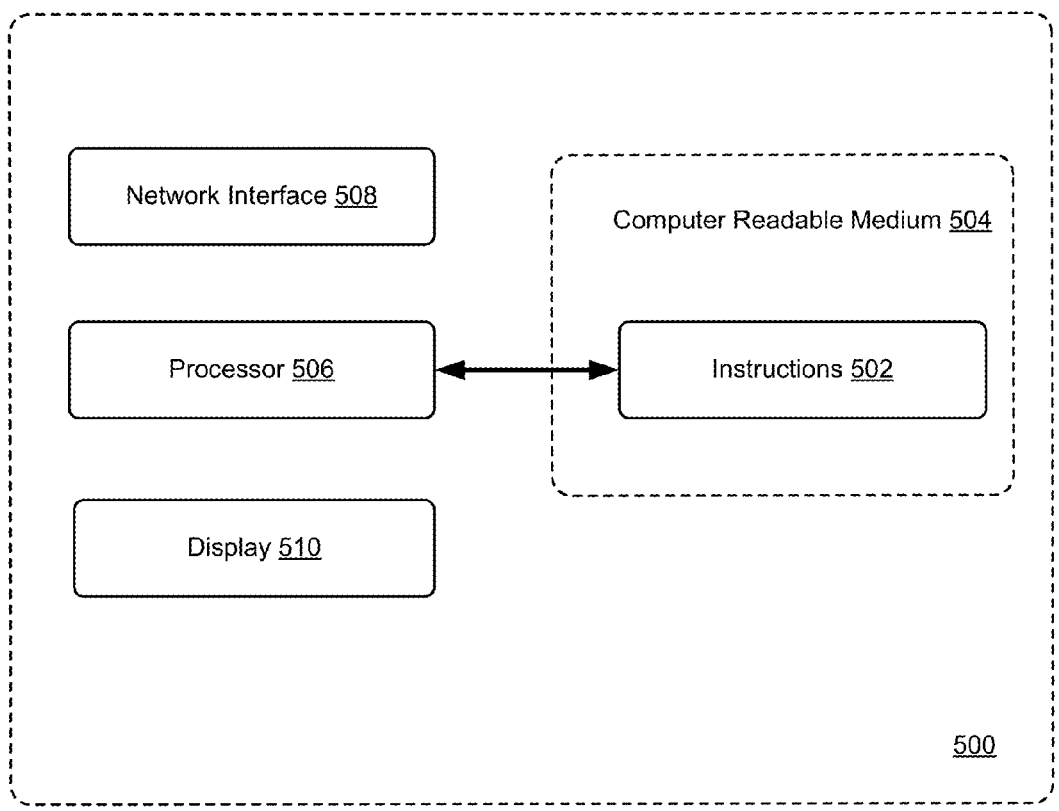
FIG. 5 is an example block diagram of a computing device configured to implement at least the method of FIG. 3, according to one embodiment of the present disclosure.

FIG. 5 is an example block diagram of a computing device 500 configured to implement at least the method 300, according to one embodiment of the present disclosure. The method 300 are implemented with executable instructions 502 stored in a non-transitory computer readable medium 504, such as a hard disk drive, a solid state drive, network attached storage (NAS), read-only memory, random-access memory (e.g., a flash memory device), a CD (Compact Discs) CD-ROM, a CD-R, or a CD-RW, a DVD (Digital Versatile Disc), a magnetic tape, and other optical and non-optical data storage devices. The computer readable medium 504 can also be distributed over a network coupled computer system so that the computer readable code is stored and executed in a distributed fashion. A processor 506 executes the executable instructions 502 to provide the described features and functionalities, which may be implemented by sending instructions to a network interface 508 or a display 510.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A method for a computing device coupled to a network to facilitate testing of an electronic apparatus with a robot, comprising:
   receiving, by the computing device, a Hypertext Transfer Protocol (HTTP) request to control the robot through the network from an apparatus, which is coupled to the network and physically separate from the computing device;
   retrieving, by the computing device, a first command from the HTTP request for the robot;
   mapping, by the computing device, the first command to a movement for the robot based on a movement library;
   converting, by the computing device, the movement for the robot to a general purpose input/out (GPIO) related signal based on a GPIO library;
   configuring, by the computing device, the robot to physically interface with the electronic apparatus to perform one or more tests by moving in different axes according to the GPIO related signal; and
   in response to a crash to the electronic apparatus caused by the one or more tests, transmitting status of the tests, instead of one or more images or video clips, indicating the occurrence of the crash and one or more conditions under which the crash occurred to the apparatus through the network.

2. The method of claim 1, wherein the request includes a GET request and/or a POST request.

3. The method of claim 1, further comprising:
   retrieving a second command for a video recorder controlled by the computing device from the request; and
   configuring the video recorder to capture an image or a video clip associated with testing the electronic apparatus according to the second command, wherein the image is one of the one or more images and the video clip is one of the one or more video clips.

4. The method of claim 1, wherein the robot is configured to move a stylus to physically interface with the electronic apparatus.

5. The method of claim 1, wherein the configuring further comprises converting the GPIO related signal to a control signal for the robot.

6. The method of claim 3, further comprising processing the one or more images or video clips associated with testing the electronic apparatus to determine the status.

7. A computing device coupled to a network to facilitate testing of an electronic apparatus with a robot, comprising:
   a memory; and
   a processing unit configured to
      receive a Hypertext Transfer Protocol (HTTP) request to control the robot through the network from an apparatus, which is coupled to the network and physically separate from the computing device;
      retrieve a first command from the HTTP request for the robot;

map the first command to a movement for the robot based on a movement library;

convert the movement for the robot to a general purpose input/out (GPIO) related signal based on a GPIO library;

configure the robot to physically interface with the electronic apparatus to perform one or more tests by moving in different axes according to the GPIO related signal, and in response to a crash of the electronic apparatus caused by the one or more tests, transmitting status of the tests, instead of one or more images or video clips, indicating the occurrence of the crash and one or more conditions under which the crash occurred to the apparatus through the network.

8. The computing device of claim 7, wherein the processing unit is further configured to:

retrieve a second command for a video recorder controlled by the computing device from the request; and configure the video recorder to capture an image or a video clip associated with testing the electronic apparatus according to the second command wherein the image is one of the one or more images and the video clip is one of the one or more video clips.

9. The computing device of claim 7, wherein the processing unit is further configured to move a stylus with the robot to physically interface with the electronic apparatus.

10. The computing device of claim 7, wherein the processing unit is further configured to convert the GPIO related signal to a control signal for the robot.

11. The computing device of claim 8, wherein the processing unit is further configured to process the one or more images or video clips associated with testing the electronic apparatus to determine the status.

12. A non-transitory computer readable medium, containing executable instructions for facilitating testing of an electronic apparatus with a robot, which in response to execution by a computing device coupled to a network, cause the computing device to:

receive a Hypertext Transfer Protocol (HTTP) request to control the robot through the network from an apparatus, which is coupled to the network and physically separate from the computing device;

retrieve a first command from the HTTP request for the robot; map the first command to a movement for the robot based on a movement library;

convert the movement for the robot to a general purpose input/out (GPIO) related signal based on a GPIO library;

configure the robot to physically interface with the electronic apparatus to perform one or more tests by moving in different axes according to the GPIO related signal; and in response to a crash of the electronic apparatus caused by the one or more tests, transmitting status of the tests, instead of one or more images or video clips, indicating the occurrence of the crash and one or more conditions under which the crash occurred to the apparatus through the network.

13. The non-transitory computer readable medium of claim 12, containing additional executable instructions, which in response to execution by the computing device, cause the computing device to:

retrieve a second command for a video recorder controlled by the computing device from the request; and configure the video recorder to capture an image or a video clip associated with testing the electronic apparatus according to the second command wherein the image is one of the one or more images and the video clip is one of the one or more video clips.

14. The non-transitory computer readable medium of claim 12, wherein the robot is configured to move a stylus to physically interface with the electronic apparatus according to a control signal converted from the GPIO related signal.

* * * * *

UNITED STATES PATENT AND TRADEMARK OFFICE
CERTIFICATE OF CORRECTION

PATENT NO.        : 9,446,519 B2
APPLICATION NO.   : 13/874425
DATED             : September 20, 2016
INVENTOR(S)       : Gavin Gray and Ben Duong It is certified that error appears in the above-identified patent and that said Letters Patent is hereby corrected as shown below:

On the Title Page

Item (73) Assignee should read: VMware, Inc., Palo Alto, CA (US)

Signed and Sealed this
Third Day of July, 2018

Andrei Iancu
*Director of the United States Patent and Trademark Office*